US008552751B2

(12) United States Patent
Kernwein

(10) Patent No.: US 8,552,751 B2

(45) Date of Patent: Oct. 8, 2013

(54) METHOD FOR DETERMINING THE HEATING CHARACTERISTIC OF A GLOW PLUG

(75) Inventor: Markus Kernwein, Bretten-Büchig (DE)

(73) Assignee: BorgWarner BERU Systems GmbH, Ludwigsburg (DE)

( * ) Notice: Subject to any disclaimer, the term of this patent is extended or adjusted under 35 U.S.C. 154(b) by 522 days.

(21) Appl. No.: 12/770,258

(22) Filed: Apr. 29, 2010

(65) Prior Publication Data

US 2010/0283489 A1 Nov. 11, 2010

(30) Foreign Application Priority Data

May 5, 2009 (DE) ......................... 10 2009 020 148

(51) Int. Cl.

| | |
|---|---|
| ***G01R 27/08*** | (2006.01) |
| ***G01R 27/28*** | (2006.01) |
| ***G06F 19/00*** | (2011.01) |
| ***F23Q 7/00*** | (2006.01) |
| ***H05B 1/02*** | (2006.01) |

(52) U.S. Cl.

USPC ............. 324/693; 324/691; 324/649; 701/99; 701/102; 361/266; 361/264; 361/265; 219/492; 219/497

(58) Field of Classification Search

USPC .......................................................... 324/693

See application file for complete search history.

(56) References Cited

U.S. PATENT DOCUMENTS

| | | | | |
|---|---|---|---|---|
| 4,283,619 | A * | 8/1981 | Abe | 219/492 |
| 4,862,370 | A * | 8/1989 | Arnold et al. | 701/113 |
| 4,939,347 | A * | 7/1990 | Masaka et al. | 219/492 |
| 5,307,701 | A | 5/1994 | Thonnard | |
| 6,009,369 | A * | 12/1999 | Boisvert et al. | 701/99 |
| 6,148,258 | A * | 11/2000 | Boisvert et al. | 701/99 |
| 7,431,004 | B2 * | 10/2008 | Kernwein et al. | 123/145 A |
| 2004/0255889 | A1 * | 12/2004 | Kumada et al. | 123/179.6 |
| 2008/0319631 | A1 | 12/2008 | Kernwein et al. | |
| 2009/0183718 | A1 | 7/2009 | Casasso et al. | |
| 2009/0294431 | A1 | 12/2009 | Sakurai | |

FOREIGN PATENT DOCUMENTS

| | | | |
|---|---|---|---|
| DE | 10 2004 016 856 | A1 | 10/2005 |
| DE | 10 2006 010 083 | A1 | 6/2007 |
| DE | 10 2008 007 391 | A1 | 8/2009 |
| EP | 2224124 | A1 * | 9/2010 |

* cited by examiner

*Primary Examiner* — Jermele M Hollington

*Assistant Examiner* — Christopher McAndrew

(57) ABSTRACT

A method for determining a heating characteristic of a glow plug, wherein pulse-width-modulated voltage pulses are applied to the glow plug and an electric variable is measured repeatedly during a voltage pulse with the heating characteristic of the glow plug determined by evaluating the difference of successive measurement results of this variable.

16 Claims, 1 Drawing Sheet

METHOD FOR DETERMINING THE HEATING CHARACTERISTIC OF A GLOW PLUG

The invention generally relates to a method for determining the heating characteristic of a glow plug such as known from DE 10 2006 010 194 A1.

At present, there is a multitude of well-known different types of glow plugs which are each different in their heating characteristic. The types of glow plugs that are customary at the moment can be roughly subdivided into ceramic glow plugs and metallic glow plugs. However, there are considerable differences not only between ceramic glow plugs and metallic glow plugs but, for example, also among ceramic glow plugs from different manufacturers and even among different types, i.e. models, of ceramic glow plugs from the same manufacturer.

An efficient glow plug control, however, requires that the heating characteristic of the used glow plug be known. It is, therefore, desirable that the type of the used glow plug can be determined automatically in order to be able to implement a glow plug operating mode that is optimally harmonized with the heating characteristic of the used glow plug.

DE 10 2006 010 194 A1 discloses a method for detecting the glow plug type wherein electric variables, for example, the resistance, the gradient of the resistance, or the inductance, are measured and the type of used glow plug can be determined by comparison with stored parameter sets each representing a specific glow plug type.

Although the known method allows distinguishing between metallic and ceramic glow plugs, it is not suitable for distinguishing among ceramic glow plugs of different types, i.e. among different models thereof or among different manufacturers.

SUMMARY OF THE INVENTION

The present invention, therefore, aims at providing a way of how the heating characteristic of a glow plug can be determined more precisely, so that it is possible to be able to even distinguish ceramic glow plugs of different types from each other.

This problem is solved by a method having the features presented in claim 1. Advantageous further developments of the inventions are the subject matter of subordinate claims.

By measuring an electric variable, for example, the resistance, repeatedly during a voltage pulse, preferably at the beginning and at the end of the voltage pulse, the difference between successive measurement results of this variable can be used to determine the heating characteristic of a glow plug much more precisely than this would, for example, be possible by simply calculating the gradient or time-derivative during the heating-up phase of the glow plug such as it is, for example, known from DE 10 2006 010 194 A1. The reason for this is that by simply calculating a gradient, it is assumed that the increase in temperature of a glow plug is steady and the gradient, accordingly, reflects a temperature-dependent electric variable of the heating characteristic of a glow plug.

Surprisingly, the results that can be obtained are much more precise if this seemingly plausible assumption is abandoned. In fact, glow plugs can cool down between the individual voltage pulses to a noticeable degree. By measuring an electric variable repeatedly, more particularly at the beginning and at the end of each voltage pulse, and forming the difference between two successive measurement results of this variable, the conclusion that can be drawn is much more precise and the plug type can, therefore, also be determined if the differences among the plug types are only minor.

Therein, a measurement result can be determined from a plurality of individual measurements, for example, 2 to 5, in rapid succession, said individual measurements being combined via a filter function, e.g., by averaging. The time interval between the first and last measurements of such a succession should, preferably, not be longer than 1/10, most preferably not longer than 1/50, of the pulse length or the time interval of the combined measurement results. By proceeding in this manner, the influence of accidental interferences is reduced and, therefore, the accuracy of the evaluation increased.

With the method according to the invention, the difference to be evaluated can each be calculated between a measurement result that is determined for the beginning of a voltage pulse and one that is determined for the end of the voltage pulse. In this manner, the heating-up behavior of a glow plug can be precisely determined and the plug type can be verified. As an alternative or in addition, it is also possible to calculate the difference between a measurement result that is determined for the end of a voltage pulse and one that is determined for the beginning of a voltage pulse following thereafter. In this manner, the cooling-down behavior of a glow plug can be determined in a reliable manner, said cooling-down behavior also being characteristic of the type of a glow plug and, therefore, of the heating-up behavior as well.

As a matter of principle, the heating characteristic of a glow plug can be determined by evaluating a single difference value. Preferably, however, a plurality of difference values is determined and evaluated. For example, the difference between a measurement result that is determined for the beginning of a voltage pulse and one that is determined for the end of the voltage pulse can be calculated and an arithmetic average be formed from such difference values and evaluated for each of a plurality of pulses. In this manner, the precision of the evaluation can be improved.

An advantageous further development of the invention provides that evaluation comprises that the difference is divided by a variable which is correlated with the energy input during a voltage pulse. In this manner, the difference is, thus, divided by a variable that correlates with the energy input between the points in time being decisive for the two measurement results. The variable correlated with the energy input can, for example, be the pulse length, the current intensity, or the on-board voltage. More particularly, it is also possible to use functions, more particularly products, of the aforementioned variables as the variable that is correlated with the energy input. More particularly, the variable that is correlated with the energy input can also be the energy input itself. The more the variable that is correlated with the energy input during the voltage pulse correlates with the energy input, the higher the increase in accuracy of the evaluation that is obtained by the division.

Preferably, the variable measured with a method according to the invention can be the electric resistance of the glow plug. As a matter of principle, however, it is also possible to measure another temperature-dependent electric variable of a glow plug, for example, the inductance, the capacitance, or a resonance frequency.

Preferably, the method according to the invention is used to determine the heating characteristic of a glow plug by determining the type of the glow plug. In general, it can be assumed that the heating characteristics of different glow plugs of the same type differ from each other, at the most, to an insignificant degree only. As a matter of principle, however, the method according to the invention can also be used to determine a potential ageing effect on the heating characteristic of a glow plug, with the result that it is even possible to distinguish between new and old glow plugs of the same type.

In particular, a glow plug type can also be detected within a glow plug type detection phase included prior to the glow cycle. The accuracy of the evaluation by means of the method described herein can be once again increased by such a phase by selecting the phase such that the mutual influence of the glow plug current feed is reduced. This can, for example, be achieved by operating the glow plugs with a defined pulse length and selecting the pulse length such that no other glow plugs are switched on and/or off during a pulse of a glow plug.

The present invention, furthermore, relates to a control unit for glow plugs, said control unit comprising a memory in which a program performing a method according to any one of the preceding claims is stored. Preferably, the memory of such a control unit contains parameter ranges which are each typical for certain glow plug types.

By comparing a parameter determined by means of a method according to the invention with the stored parameter ranges, a glow plug can, therefore, be uniquely allocated to a glow plug type and, thereafter, be activated with a heating-up program that is optimal for the particular plug type.

BRIEF DESCRIPTION OF THE DRAWINGS

Further details and advantages of the invention will be illustrated by means of an exemplary embodiment, with reference made to the enclosed drawings. In the figures.

DETAILED DESCRIPTION

Figure 1:
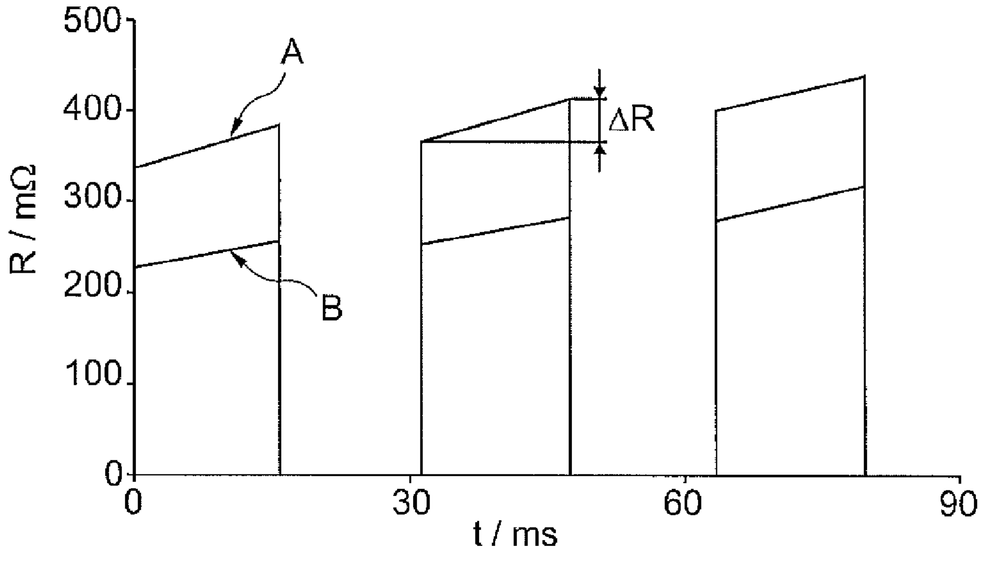
FIG. 1 shows the resistance curve of two ceramic glow plugs of different types at an output temperature of 25° C.

FIG. 1 presents, by way of example, the electric resistance R in mΩ against the time t in milliseconds for two ceramic glow plugs of types A and B during three voltage pulses of 12V, The glow plug of type A is a plug sold by BOSCH under the model name of GLP5, while the glow plug of type B is a plug sold by BERU under the model name of CGP.

As can be seen from FIG. 1, both the absolute values of the resistance and the increases in resistance during a voltage pulse are different in the glow plugs of the two types A, B. On closer examination, it can, in addition, be seen that the resistance value at the beginning of a pulse is somewhat smaller than the resistance value at the end of the preceding pulse.

In order to be able to allocate a given glow plug to a specific glow plug type, an electric variable, for example, the resistance R is measured at the beginning and at the end of at least one voltage pulse, and the difference between successive measurement results of this variable is formed. In the simplest case, the electric variable is measured exactly twice during one voltage pulse. The measured values of the individual measurements, then, are the measurement results between which the difference is formed. It is possible to obtain an increased accuracy by taking a plurality of measurements, for example, 2 or 3, shortly one after the other at the beginning of a voltage pulse and to form a measurement result for the beginning of the voltage pulse from the measured values thus obtained, for example by combining the individual measured values via a filter function, e.g., by averaging. In a corresponding manner, a plurality of measurements can be taken shortly one after the other at the end of a voltage pulse and a measurement result for the end of the voltage pulse can be formed from the measured values thus obtained.

The difference of the electric resistances at the beginning and at the end of a voltage pulse is plotted as ΔR in FIG. 1. To be evaluated, the difference is divided by the energy input achieved during the pulse. The energy input during a pulse is the product of the pulse length, the current intensity, and the voltage. For evaluation purposes, however, it is, for example, also possible to approximate the energy input by means of the product of pulse length and current intensity if it is assumed that the voltage is approximately constant.

The energy input between two measurements can, for example, be achieved continuously by means of an integrator or by adding individual periods. It is particularly advantageous to calculate the energy from a linear interpolation of the voltage and current values measured at the times at which the measurements were taken.

Figure 2:
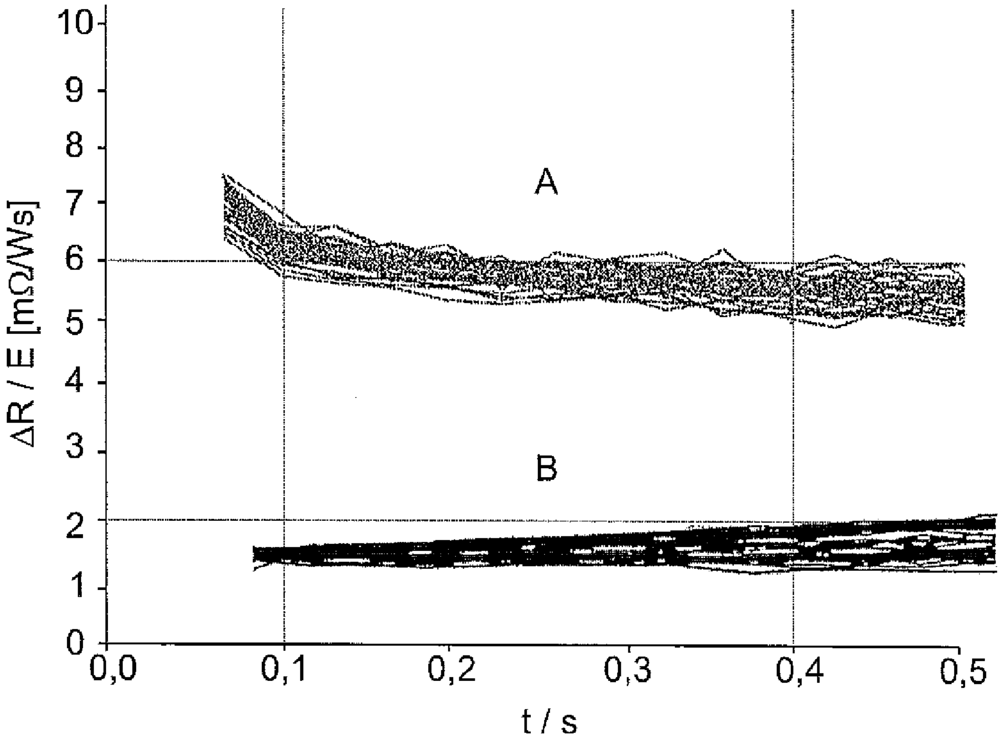
FIG. 2 shows the curve of a parameter formed by means of a method according to the invention, while the heating-up phase of ceramic glow plugs of different types is in progress.

FIG. 2 shows for different glow plugs of types A and B the evolution over time of the value of the quotient thus formed from the change in resistance ΔR during a pulse and the energy input E achieved during the pulse. It is apparent that the values of the individual glow plugs form two distinctly different groups. A first group of values having been determined in glow plugs of type A is within a range from 1.5 to 2.5; a second group of values having been determined in glow plugs of type B is approximately between 5 and 7.5. The values of glow plugs of types A and B, therefore, differ from each other by a factor of approximately 3, this being considerably higher than the variance in the values of individual glow plugs of the same type. FIG. 2, therefore, shows that the quotients described are parameters that are characteristic of the glow plug types A and B and can, consequently, be used to allocate a glow plug to a specific type. The method according to the invention, therefore, allows detecting the type of a glow plug in a reliable manner.

Surprisingly, the values within the scope of measurement accuracy are almost constant over time. Since the glow plugs are heated up by current pulses with time progressing, the approximately constant curve means that the value of the quotient is approximately independent of the temperature. This is an important advantage because, as a consequence, the initial temperature does not play any role in the application of the method. The method can, therefore, be used with a cold glow plug the temperature of which can range from −30° C. to +40° C. depending on weather conditions, as well as with a hot glow plug the temperature of which may be several hundred degrees because of preceding engine operation.

As a matter of principle, the type of a given glow plug can already be determined by means of a single value that was calculated for a single current pulse. However, the reliability of the allocation can be improved if evaluation is assisted by a plurality of values. It is, for example, possible to calculate a function which depends on the differences between neighboring values of a series of measurement results of a variable that is measured at the beginning and at the end of a voltage pulse. It is, in particular, possible to calculate the arithmetic average of a succession of parameters which were calculated by evaluating the difference between successive measurement results of an electric variable.

For measurement engineering reasons, FIG. 2 shows no values for the first two current pulses. The third and following current pulses already show a clear difference between the values of glow plugs of type A and those of type B, wherein the value of the quotients is approximately constant. As has already been mentioned, this means that the described method can be used to allocate glow plugs to a specific type irrespective of their initial temperature. The heating characteristic of a glow plug can be determined by means of such an allocation in a reliable manner. For example, heating characteristics of all established glow plug types can be stored in a memory of a control unit. By allocating a glow plug to a specific type, the control unit can activate a glow plug in a manner optimally harmonized with the heating-up behavior as quickly as within a very short time.

The described method is to advantage in that, by evaluating the difference between successive measurement results of an electric variable, it is possible to determine a parameter which is characteristic of the type of a glow plug and, more particularly, even allows distinguishing among ceramic glow plugs of different types. By comparing the parameter to be determined with specified parameter ranges, the glow plug type of a given glow plug can, therefore, be determined.

The length of the current pulses, by itself, is of no significance for the method according to the invention. In particular, the parameter determined according to the invention, which is used for determining the plug type, is independent of the pulse length to a very high degree, with the result that the pulse length can be changed while the plug type is being determined. Typically, the pulse length ranges from 5 ms to 120 ms.

Application of the described method is possible with a control unit for glow plugs which comprises a memory, with a program performing such a method during operation being stored in said memory. With regard to its hardware components, such a control unit can be designed as are conventional control units and can be characterized by its memory contents only. In addition to software performing the method described above for detecting a glow plug type, the memory, preferably, contains different parameter ranges to which a parameter determined by means of the method according to the invention is compared. The individual parameter ranges are each characteristic of specific glow plug types, with the result that a glow plug can be uniquely allocated to a specific type by comparing it with the parameter ranges.

Additionally, various heating-up routines or control variables, for example, a setpoint for the effective voltage after an optimum operating temperature has been reached, can be stored in the memory of the glow plug control unit. In this manner, a glow plug can always be activated with a program that is the best for the heating characteristic of the particular glow plug type after the method according to the invention has been performed. Preferably, a control routine or control variables are, furthermore, also stored in the memory, said control routine or control variables being used if the parameters determined for a glow plug do not allow allocating it to a known type. This case can, for example, occur if glow plug types come into the market, which were not yet known when the control unit was produced and/or programmed.

What is claimed is:

1. A method for determining the heating characteristic quotient of a glow plug, wherein pulse-width-modulated voltage pulses are applied to said glow plug, wherein an electric variable is measured repeatedly during a single voltage pulse and the heating characteristic quotient of the glow plug is determined by evaluating a calculation comprising a difference between the successive measurement results of this electric variable divided by a second variable, where the second variable is correlated with the energy input during the single voltage pulse.

2. The method according to claim 1, wherein the electric variable is measured at the beginning and at the end of the single voltage pulse in order to determine two successive measurement results of the electric variable.

3. The method according to claim 1, wherein the second variable correlated with the energy input is the pulse length.

4. The method according to claim 1, wherein the second variable correlated with the energy input is the current intensity.

5. The method according to claim 1, wherein the second variable correlated with the energy input is the on-board voltage.

6. The method according to claims 1, wherein the second variable correlated with the energy input is the energy input itself.

7. The method according to claim 1, wherein the measured electric variable is the electric resistance.

8. The method according to claim 1, wherein the measurement results are each determined by a plurality of measurements.

9. A method for identifying a glow plug, comprising:
- applying a plurality of pulse-width-modulated pulses to the glow plug;
- measuring a plurality of first electrical variables near or at the beginning of each of the plurality of pulse-width-modulated pulses;
- measuring a plurality of second electrical variables near or at the end of each of the plurality of pulse-width-modulated pulses;
- calculating an average of the plurality of first electric variables;
- calculating an average of the plurality of second electric variables; and
- calculating a difference between the average of the plurality of first and second electric variables.

10. The method according to claim 9, including the step of determining a heating characteristic quotient by dividing the difference by a second variable, said second variable being correlated with the energy input during the plurality of pulse-width-modulated pulses.

11. The method according to claim 1, wherein, the heating characteristic quotient of the glow plug is compared with stored parameter values each of which represents a specific glow plug type with a known heating characteristic quotient and the glow plug type and an optimum heating-up program are, thus, determined.

12. A method for identifying a glow plug, comprising:
- applying a pulse-width-modulated pulse to the glow plug;
- measuring a first resistance near or at a beginning of the pulse-width-modulated pulse;
- measuring a second resistance near or at an end of the pulse-width-modulated pulse;
- calculating a resistance difference between the first and second resistance;
- determining an energy correlated variable associated with the pulse-width-modulated pulse; and
- dividing the resistance difference by the energy correlated variable to arrive at a glow plug characteristic quotient.

13. The method of claim 12, including the step of selecting an optimum heating-up program from a plurality of preprogrammed heating-up programs by comparing the glow plug characteristic quotient to a plurality of predetermined glow plug characteristic quotients.

14. The method of claim 13, including the step of applying the optimum heating-up program to the glow plug.

15. The method of claim 12, wherein the energy correlated variable comprises pulse length, current, voltage or power.

16. The method of claim 12, including the step of identifying the glow plug by comparing the glow plug characteristic quotient with a plurality of stored glow plug characteristic quotients.

* * * * *